United States Patent
Horiuchi et al.

(10) Patent No.: US 6,943,115 B2
(45) Date of Patent: Sep. 13, 2005

(54) SEMICONDUCTOR DEVICE AND METHOD OF MANUFACTURE THEREOF

(75) Inventors: Hiroshi Horiuchi, Kawasaki (JP);
Tamotsu Yamamoto, Kawasaki (JP);
Yukio Takigawa, Kawasaki (JP);
Shigeru Suzuki, Kawasaki (JP);
Nobuaki Santo, Kawasaki (JP);
Motoshu Miyajima, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/326,883

(22) Filed: Dec. 23, 2002

(65) Prior Publication Data

US 2003/0137052 A1 Jul. 24, 2003

Related U.S. Application Data (63) Continuation of application No. PCT/JP00/04164, filed on Jun. 23, 2000.

(51) Int. Cl.$^7$ .................. H01L 21/302; H01L 21/461
(52) U.S. Cl. ................................................ 438/692
(58) Field of Search ............................. 438/115, 677, 438/692, 906, 633; 134/1.3, 2, 902; 210/175

(56) References Cited

U.S. PATENT DOCUMENTS

| | | | | |
|---|---|---|---|---|
| 5,190,627 A | * | 3/1993 | Saito et al. | 204/158.2 |
| 5,447,640 A | * | 9/1995 | Omi et al. | 210/748 |
| 5,635,053 A | * | 6/1997 | Aoki et al. | 205/746 |
| 5,795,494 A | * | 8/1998 | Hayami et al. | 216/83 |
| 6,218,290 B1 | * | 4/2001 | Schonauer et al. | 438/633 |
| 6,290,777 B1 | * | 9/2001 | Imaoka et al. | 134/1 |
| 6,348,157 B1 | * | 2/2002 | Ohmi et al. | 210/760 |
| 6,471,783 B1 | * | 10/2002 | Gotoh et al. | 134/3 |
| 6,562,184 B2 | * | 5/2003 | Sommer | 156/345.12 |

FOREIGN PATENT DOCUMENTS

| | | |
|---|---|---|
| EP | 0 810 643 A2 | 12/1997 |
| JP | 4-40270 | 2/1992 |
| JP | 6-177102 | 6/1994 |
| JP | 6-318584 | 11/1994 |
| JP | 7-60209 | 3/1995 |
| JP | 8-306786 | 11/1996 |
| JP | 10-64870 | 3/1998 |
| JP | 10-72594 | 3/1998 |
| JP | 10-128253 | 5/1998 |
| JP | 2000-40679 | 2/2000 |
| JP | 2000-091277 | 3/2000 |

* cited by examiner

*Primary Examiner*—David A. Zarneke
(74) *Attorney, Agent, or Firm*—Armstrong, Kratz, Quintos, Hanson & Brooks, LLP (57) ABSTRACT

A method is provided for manufacturing a semiconductor device having a multilayer wiring structure in which at least one insulating film is formed with a set of conducting portions which are electrically connected to each other to have a surface area of no less than 500 $\mu m^2$ and which include a wiring having a width of no more than 1.0 $\mu m$. The method includes a polishing step for flattening the conducting portions together with the insulating film by chemical mechanical polishing, a chemical cleaning step for cleaning the flattened surface of the insulating film with a cleaning liquid, and a rising step for removing the cleaning liquid using a rinsing liquid. The rinsing step is performed using water with a dissolved oxygen concentration decreased to no more than 6 ppm by weight as the rinsing liquid.

16 Claims, 7 Drawing Sheets

FIG. 3
CMP Step

FIG. 4
Chemical Cleaning Step

FIG.5

Rinsing Step

FIG.6

Drying Step

SEMICONDUCTOR DEVICE AND METHOD OF MANUFACTURE THEREOF

REFERENCE TO RELATED APPLICATION

This application is a continuation of International Application PCT/JP00/04164 filed Jun. 23, 2000.

TECHNICAL FIELD

The present invention relates to a semiconductor device having a multilayer wiring structure, and to a method of manufacturing a semiconductor device having a multilayer wiring structure, which includes the steps of chemical mechanical polishing (CMP) for flattening the surface of an insulating film and the accompanying cleaning and rinsing steps.

BACKGROUND ART

Recently, there is an increasing demand for a semiconductor device having a high processing speed and a large storage. To meet the demand, semiconductor devices are manufactured having a multilayer wiring structure which realizes an increased wiring density. In such a semiconductor device having a multilayer wiring structure, each layer is formed with a predetermined conductor pattern. The conductor pattern comprises conducting portions such as metal wirings, metal plugs and pads. The metal plug (which comprises a metal material filled in a connection hole) functions to electrically connect two different layers to each other. To attain a much higher density, there is a need for decreasing the width of metal wirings. For this purpose, the metal wiring needs to have a low resistance and a high anti-electromigration property. Therefore, metal wirings and plugs made of Cu or a Cu alloy, which is a good conductor and has a high anti-electromigration property, are being developed.

The damascene process is known as a process for making metal wirings or plugs of Cu or a Cu alloy in a multilayer wiring structure. The technique of the damascene process is described, for example, in C. W. Kaanta et. al., VMIC Conf. Proc. 8, P.144 (1991).

In the damascene process, one layer including metal wirings and plugs is formed as follows. First, an insulating film is formed on a substrate, and wiring grooves for later housing metal wirings and/or connection holes for later housing plugs are formed in the insulating film by etching. Subsequently, a wiring material is deposited in the wiring grooves and the connection holes, thereby forming metal wirings and plugs in a complete product. At this time, the wiring material is deposited also at the portions on the insulating film where the wiring grooves and the connection holes are not formed. The wiring material deposited on the insulating film is removed through the polishing process by CMP. The polishing process flattens the insulating film so that the upper surface of the insulating film is flush with the upper surface of the metal wirings and the plugs formed in the insulating film, thereby providing predetermined conducting portions. In this way, in the normal damascene process, the wiring grooves and the corresponding connection holes are formed individually with respect to each layer by the wiring material loading step and the following CMP step.

On the other hand, the dual damascene process is also known. In this process, wiring grooves are formed in a first insulating film whereas connection holes opening toward the wiring grooves are formed in a second insulating film arranged under the first insulating film. After the wiring material is loaded simultaneously with respect to the wiring grooves and the connection holes, the CMP process is performed with respect to the first insulating film.

In the polishing by CMP, the surface of a substrate is polished for flattening using a slurry containing silica or alumina for example. Subsequently, the substrate surface is polished using pure water as required. In polishing, the surface of the semiconductor substrate is contaminated by silica or alumina itself or by metal of the polished metal wirings or plugs. Such contamination of the semiconductor substrate by metallic impurity influences the electric characteristics of the semiconductor, deteriorating the reliability of the device. Therefore, a cleaning step for removing the metallic impurity from the semiconductor substrate surface need be performed after the CMP step.

In the cleaning step, cleaning is performed using a predetermined chemical cleaning liquid to remove the metallic impurity on the substrate surface. After the cleaning step, a rinsing step is performed using pure water to remove the cleaning liquid. To remove the metallic impurity, the chemical cleaning liquid needs to have a dissolving power for metal. Conventionally, however, the conducting portions exposed at the layer surface after the polishing step corrodes in the cleaning step due to the strong metal dissolving power of the cleaning liquid.

For preventing an electronic component or the like from oxidizing or corroding during the cleaning, JP-A-4-40270 discloses a technique in which an electronic component is cleaned using pure water of a decreased dissolved oxygen concentration. However, such cleaning using pure water cannot remove the metal contaminant after the CMP step. As another method for preventing the oxidization or corrosion of an electronic component orthelike, JP-A-7-60209, JP-A-10-128253 and JP-A-6-318584 each discloses a technique in which an electronic component is rinsed with pure water of a decreased dissolved oxygen concentration after the cleaning step to remove the cleaning liquid. However, the technique disclosed in these documents relates to the rinsing liquid for use after the general cleaning process of electronic components, and does not assume the existence of such a cleaning liquid having a metal dissolving power as that used in the cleaning step following the CMP step.

On the other hand, JP-A-10-72594 discloses a technique for suppressing the corrosion which occurs through the cleaning step following the CMP process. In this technique, the cleaning step is performed using a cleaning liquid containing organic acid including carboxyl group, and a complexing agent such as EDTA. The use of organic acid, which has a relatively low metal dissolving power, can suppress the corrosion at the surfaces of the metal wirings. Further, according to JP-A-10-72594, owing to the existence of the complexing agent, the cleaning ability of the cleaning liquid is not degraded even by the use of organic acid having a relatively low metal dissolving power.

However, even when the cleaning is performed using organic acid having a relatively low metal dissolving power for the cleaning liquid, the wiring material of the conducting portions is partially lost, i.e. corroded at some locations on the layer after the cleaning and rinsing steps following the CMP process. The inventors have found that such local metal corrosion occurs in the rinsing step, not in the cleaning step.

Figure 9:
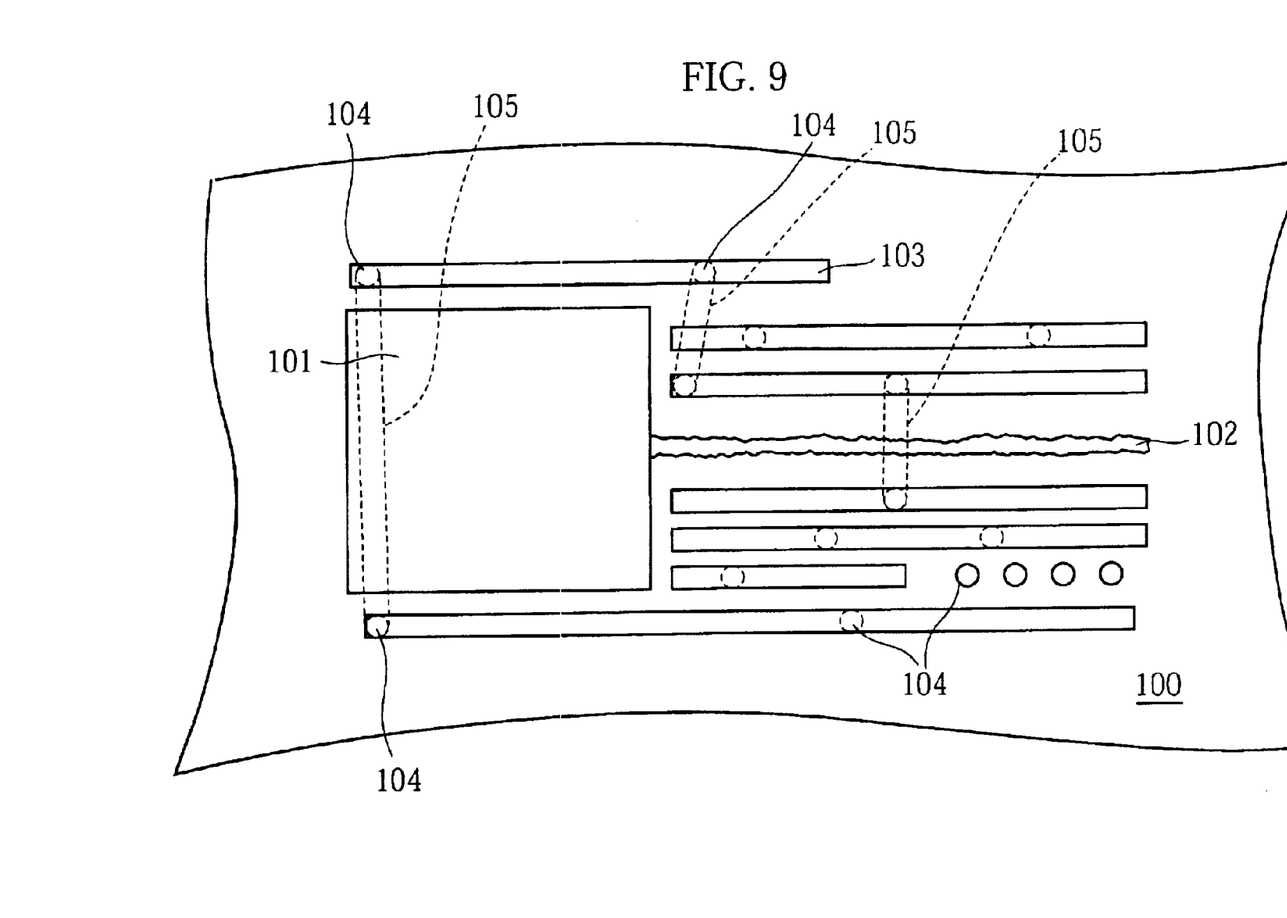
FIG. 9 is a schematic view illustrating local corrosion of a metal wiring conventionally occurred in the rinsing step.

FIG. 9 is a schematic view illustrating the local corrosion of a metal wiring conventionally occurred in the rinsing step.

Shown in FIG. 9 is part of one layer after the CMP process and the subsequent cleaning and rinsing steps, in which a predetermined conductor is formed as embedded in an insulating film 100. The conductor pattern comprises a pad 101, metal wirings 102, 103 and metal plugs 104 as conducting portions formed in a same layer. The metal wiring 102 is electrically connected to the pad 101 to provide a set of conducting portions in the conducting pattern. The metal wiring 102 is locally corroded at the edge portions. Although the pad 101 is actually corroded at the edge portions, the corrosion is not illustrated for simplicity, because local corrosion in such a large area does not provide a significant problem. One metal wiring 103 and another metal wiring 103 are separated from each other within the same layer, but electrically connected to each other to provide another set of conducting portions. The electrical connection between these two metal wirings 103 is provided by a metal wiring 105 electrically connected to the both metal wirings 103 via the metal plugs 4 formed in the underlying layer.

The inventors have found that local corrosion occurs at the edges of a conducting portion having a relatively large area, and at the edges of a set of conducting portions electrically connected to each other to have a relatively large area in a same layer. Specifically, as can be seen at the edges of the metal wiring 102 in FIG. 9, local corrosion develops to a considerable degree at the edges of a conducting portion having a surface area of no less than 500 $\mu$m$^2$, and at the edges of a set of conducting portions electrically connected to each other to have a surface area of no less than 500 $\mu$m$^2$ in a same layer. The reason why the local corrosion does not occur at the edges of the metal wirings 103 of FIG. 9 is that the set of conducting portions including the metal wirings 103 does not have a surface area of no less than 500 $\mu$m$^2$ in the layer shown in FIG. 9. The local corrosion during the rinsing step occurs even at a set of conducting portions that consists of wirings only and does not include a pad, if the set of conducting portion has a surface area of no less than 500 $\mu$m$^2$ in a same layer.

Metal corrosion in an aqueous solution occurs as local cell reaction, which is the combination of cathodic reduction reaction which occurs because hydrogen ions or dissolved oxygen in the solution act on the metal surface as oxidizer, and anodic dissolution reaction in which metal is oxidized to dissolve in the aqueous solution. For example, in the case where the metal is Cu and the oxidizer is dissolved oxygen, the anodic dissolution reaction is represented by the formula (I), whereas the cathodic reduction reaction is represented by the formula (II). In a metal surface, the point where the cathodic reaction is likely to occur is called a cathodic reaction active site, whereas the point where the anodic reaction is likely to occur is called an anodic reaction active site. The distribution of the two kinds of active sites varies depending on the physicochemical state of the metal surface, i.e. the lattice structure and the concentration of the contacting solution and the like.

$$Cu \rightarrow Cu^{2+} + 2e^- \quad (I)$$

$$1/2O_2 + H_2O + 2e^- \rightarrow 2OH^- \quad (II)$$

The CMP process and the accompanying cleaning and rinsing steps are carried out using an aqueous solution. Therefore, in the case where the metal wirings are formed of Cu for example, the corrosion of the Cu wirings occurs as local cell reaction provided by the combination of the anodic reaction (I) and the cathodic reaction (II) When the anodic reaction (I) and the cathodic reaction (II) occur evenly on the surface of the wirings, the Cu wirings corrode generally uniformly. On the otherhand, when each of the two kinds of reaction occurs locally, the dissolution of Cu occurs locally at the anodic reaction active sites, resulting in local corrosion, i.e. local loss of the Cu wirings. JP-A-10-72594 described before discloses the use of organic acid having a low metal dissolving power together with a complexing agent instead of the conventionally used inorganic acid having a high metal dissolving power. Since the driving force of the organic acid for the anodic dissolution reaction, i.e. the metal dissolving power of the organic acid is relatively low, the use of organic acid as an active ingredient of the cleaning liquid suppresses the uniform corrosion of the metal wirings.

However, even when the cleaning step is performed using organic acid having a low metal dissolving power for the cleaning liquid, the conductor pattern having undergone the subsequent rinsing step suffer from local corrosion of the wiring material at a set of conducting portions electrically connected to each other to have a surface area of no less than 500 $\mu$m$^2$ in a same layer or at a conducting portion having a surface area of no less than 500 $\mu$m$^2$, as does in the metal wiring 102 of FIG. 9.

During the rinsing step, the concentration of the cleaning liquid remaining on the substrate surface gradually decreases to inevitably pass the ultralow concentration range, finally reaching substantially zero. The inventors have found that the local corrosion is likely to occur when the concentration lies in the ultralow concentration range of $4.70 \times 10^{-4}$–$1.96 \times 10^{-7}$ mol/l. When the cleaning liquid lies in the ultralow concentration range, on the surface of a set of conducting portions electrically connected to each other to have a surface area of no less than 500 $\mu$m$^2$ in a same layer or of a conducting portion having a surface area of no less than 500 $\mu$m$^2$, the anodic reaction active sites are localized at edges of a metal wiring, i.e. at a narrower portion, whereas the cathodic reaction active sites are localized at other portions of the surfaces of a metal wiring and/or a pad, i.e. at a wider portion. Therefore, the two kinds of reaction differ largely in reaction rate per unit area. Conceivably, this is the reason why the local corrosion develops. The reaction rate per unit area of the anodic reaction (I) is higher than that of the cathodic reaction (II), so that the dissolution reaction locally develops at the anodic reaction active sites, causing local corrosion. The local corrosion of the wiring material is extremely small at the edges of a set of conducting portions which are electrically connected to each other and which have a surface area smaller than 500 $\mu$m$^2$ in a same layer.

To prevent such corrosion in the rinsing step, a rinsing liquid may be used which contains pure water and a corrosion inhibitor such as benzotriazole added to the water. However, although the use of such a rinsing liquid suppresses the local corrosion, it provides another problem. That is, when the pure water containing a corrosion inhibitor is used in the rinsing step, only the pure water evaporates in the subsequent drying step, leaving most of the corrosion inhibitor on the surface of the semiconductor substrate. When a next insulating film is laminated on the substrate surface in such a state, the corrosion inhibitor may be sandwiched between the conducting portions and the insulating film. This deteriorates the adhesion strength between the layers, causing the release of the layer at that portion. In this way, the use of corrosion inhibitor in the rinsing step causes another problem and hence is not preferable.

It is also found that the similar problems occur during the polishing using pure water in the CMP process. In the process of replacing the polishing liquid adhering to the semiconductor substrate surface with pure water, the concentration of the polishing liquid gradually decreases to inevitably pass the ultralow concentration range, finally reaching substantially zero. When the concentration of the polishing liquid lies in the ultralow concentration range, problems similar to those of the rinsing step occur. That is, local corrosion occurs at the edges of a set of conducting portions electrically connected to each other to have a surface area of no less than 500 $\mu m^2$ in a same layer or at the edges of a conducting portion having a surface area of no less than 500 $\mu m^2$.

DISCLOSURE OF THE INVENTION

An object of the present invention is to provide a method of manufacturing a semiconductor device which is capable of solving or at least alleviating the problems described above.

Another object of the present invention is to provide a semiconductor device having a structure which is capable of solving or at least alleviating the problems described above.

According to a first aspect of the present invention, there is provided a method of manufacturing a semiconductor device having a multilayer wiring structure in which at least one insulating film is formed with a conductor pattern which includes at least one set of conducting portions electrically connected to each other. The method comprises a polishing step for flattening the conducting portions together with the insulating film by chemical mechanical polishing, a chemical cleaning step for cleaning a flattened surface of the insulating film with a cleaning liquid, and a rising step for removing the cleaning liquid using a rinsing liquid. The rinsing step is performed using water with a dissolved oxygen concentration decreased to no more than 6 ppm by weight as the rinsing liquid.

According to a second aspect of the present invention, there is provided a method of manufacturing a semiconductor device having a multilayer wiring structure in which at least one insulating film is formed with a conductor pattern which includes at least one set of conducting portions electrically connected to each other. The method comprises an insulating film forming step for forming an insulating film on a substrate, a pattern forming step for forming a wiring groove and a connection hole in the insulating film, a metal film forming step for applying a metal material to the insulating film to fill the wiring groove and the connection hole with the metal material, a polishing step for polishing the metal film by chemical mechanical polishing so that the metal material filled in the wiring groove and the connection hole remains as conducting portions, a cleaning step for cleaning the polished insulating film with a cleaning liquid, a rinsing step for removing the cleaning liquid with water with a dissolved oxygen concentration of no more than 6 ppm by weight, and a drying step for removing the water used in the rinsing step.

Preferably, the dissolved oxygen concentration of the water as the rinsing liquid is no more than 4 ppm by weight.

Preferably, the conductor pattern is formed of Cu or a Cu alloy.

Preferably, the set of conducting portions has a surface area of no less than 500 $\mu m^2$.

In an embodiment of the present invention, the set of conducting portions includes a pad, and a wiring directly connected to the pad.

In another embodiment of the present invention, the set of the conducting portions of the one insulating film includes a plurality of wirings which are electrically connected to each other via a conductor pattern of an underlying insulating film.

Alternatively, the set of the conducting portions may be made up of several bent or branched portions of a single wiring.

More preferably, the wiring of the conducting portions has a width of no more than 1.0 $\mu m$.

Preferably, the cleaning liquid used in the cleaning step includes at least one of organic acid, inorganic acid and alkali. More preferably, at least one organic acid is selected from the group consisting of oxalic acid, malonic acid, succinic acid, glutaric acid, adipic acid, maleic acid, fumaric acid, tartaric acid, citric acid, malic acid, acetic acid, salicylic acid. The inorganic acid may be diluted hydrofluoric acid, and the alkali may be ammonia.

Preferably, the cleaning liquid may further contain a surface-active agent. More preferably, the surface-active agent is ammonium dodecylsulfonate and/or n-ammonium dodecylbenzenesulfonate.

Preferably, the polishing step includes a first polishing treatment using a chemical slurry and a second polishing treatment using water with a dissolved oxygen concentration decreased to no more than 6 ppm by weight. More preferably, the dissolved oxygen concentration of the water used in the second polishing treatment is no more than 4 ppm by weight.

Preferably, the chemical slurry is a mixture of organic acid, inorganic acid, a complexing agent and abrasive grain.

With the methods according to the first and the second aspects of the present invention, the local corrosion, which conventionally occurred in the rinsing step accompanying the chemical cleaning step after the CMP step, can be prevented by decreasing the dissolved oxygen concentration in the rinsing liquid. This is because, due to the low dissolved oxygen concentration, the cathodic reaction (II) is suppressed so that the anodic reaction (I) is also suppressed. Therefore, the local loss of the Cu wiring can be prevented even when the concentration of the cleaning liquid remaining on the substrate surface lies in the ultralow concentration range during the rinsing step and the potential anodic reaction active sites are localized at the edges of the Cu wiring.

Similarly, for the same reason, the use of pure water of a decreased dissolved oxygen concentration as the polishing liquid in the second polishing treatment in the CMP step makes it possible to prevent the local loss of the metal wiring.

Moreover, since the local corrosion is prevented by the use of pure water of a decreased dissolved oxygen concentration in the rinsing step and the second polishing step, it is not necessary to add a corrosion inhibitor to the pure water. Therefore, the release of an insulating film from the wirings due to the residue of corrosion inhibitor can be avoided.

According to a third embodiment of the present invention, there is provided a semiconductor device having a multilayer wiring structure comprising a plurality of laminated insulating films each of which is formed with a conductor pattern, the conductor pattern on each of the insulating films including a plurality of conducting portions. In this semiconductor device, each of the conducting portions or each set of conducting portions electrically connected to each other in a same insulating layer has a surface area of no more than 500 $\mu m^2$.

Preferably, the conductor pattern is formed of Cu or a Cu alloy. Preferably, the conductor pattern on each of the insulating films includes a wiring having a width of no more than 1.0 $\mu m$.

With this structure, the local corrosion at conducting portions can be prevented without using pure water of a decreased dissolved oxygen concentration in the rinsing step and the second polishing step. The local corrosion of a conducting portion in the rinsing step and the second polishing step occurs conspicuously at the edges of a conducting portion having a surface area of no less than 500 $\mu m^2$ or at the edges of conducting portions electrically connected to each other to have a surface area of no less than 500 $\mu m^2$ in a same layer. Therefore, such local corrosion can be prevented when each of the conducting portions or each set of conducting portions electrically connected to each other has a surface area of no more than 500 $\mu m^2$ in a same insulating layer. At a conducting portion or at a set of conducting portions having a surface area of no more than 500 $\mu m^2$, the reaction rate per unit area does not differ largely between the anodic reaction (I) and the cathodic reaction (II). Therefore, the local cell reaction and the resulting corrosion hardly occur. The local corrosion provides a significant problem when the wiring of the conducting portion has a width of no more than 1 $\mu m$, because the proportion of the lost wiring material is large when the wiring has a width of no more than 1 $\mu m$.

Various features and advantages of the present invention will become apparent from the detailed description given below with reference to the accompanying drawings.

BEST MODE FOR CARRYING OUT THE INVENTION

Preferred embodiments of the present invention will be described below in detail with reference to FIGS. 1–8.

Figure 1:
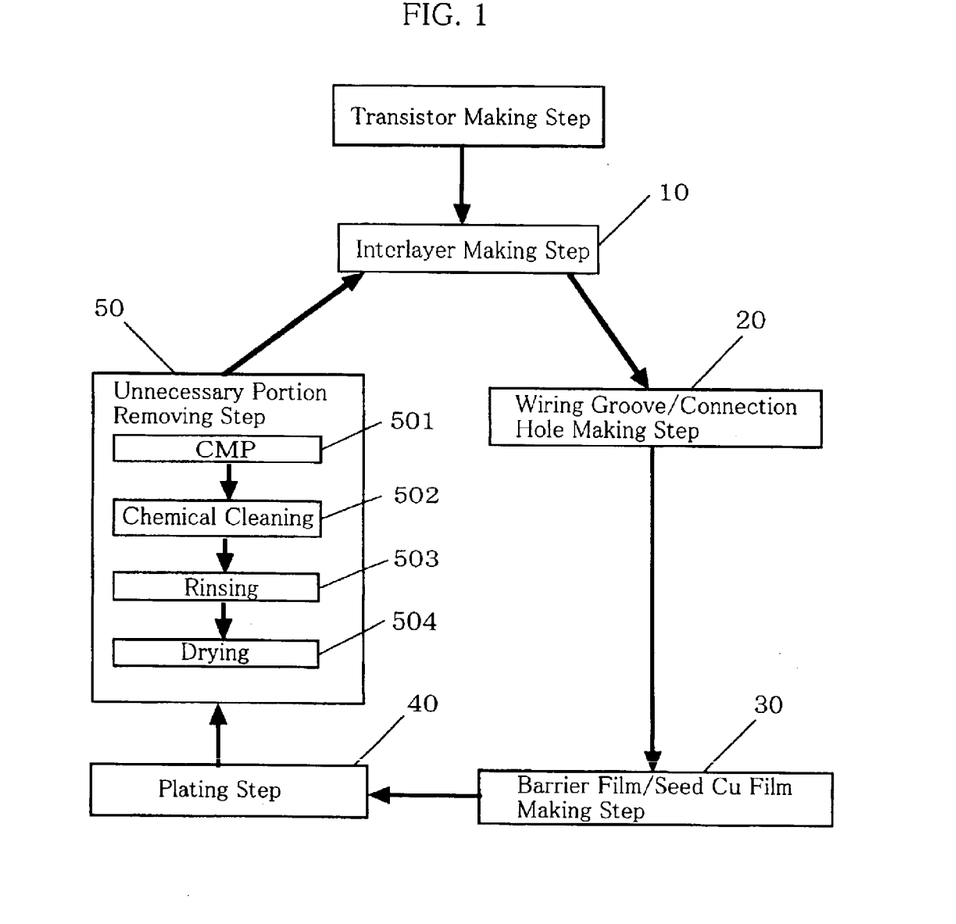
FIG. 1 is a flow chart of a multilayer wiring structure manufacturing process utilized in the present invention.
Figure 2:
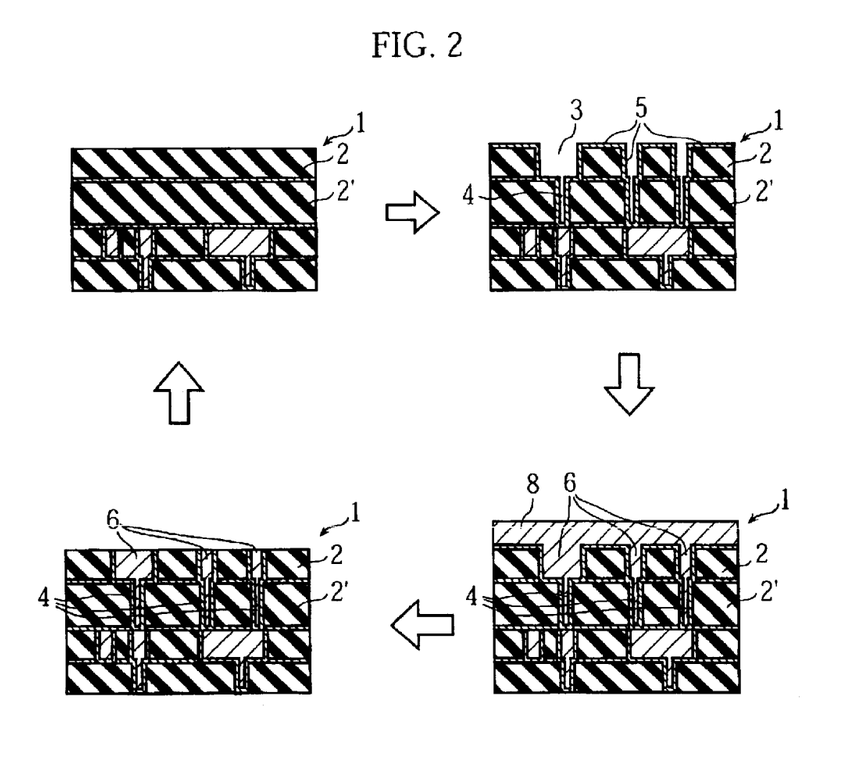
FIG. 2 is a sectional view of a wafer in each of the process steps shown in FIG. 1.

FIG. 1 is a flow chart of a multilayer wiring structure manufacturing process utilized in the present invention. FIG. 2 is a sectional view of a wafer during the multilayer wiring structure manufacturing process shown in FIG. 1. In the embodiment shown in FIGS. 1 and 2, the multilayer wiring structure is formed by the dual damascene process as described below.

First, a wafer 1, which has undergone the transistor making step, is subjected to an interlayer making step 10. In the interlayer making step 10, an insulating film 2 as an interlayer is formed on the wafer 1.

Subsequently, in a wiring groove/connection hole making step 20, wiring grooves 3 for later housing metal wirings are formed in the insulating film 2, whereas connection holes 4 for later housing plugs are formed in an insulating film 2 lying under the insulating film 2.

Then, in a barrier film/seed Cu film making step 30, barrier films 5 are formed on the surfaces of the wiring grooves 3 and the connection holes 4, and then seed cu films (not shown) are formed on the surfaces of the barrier films 5. The barrier films 5 are provided to prevent Cu, which will be later formed thereon as a film, from diffusing in the insulating film 2. The seed cu films are necessary in the following plating step.

Subsequently, in the plating step 40, Cu as a wiring material is deposited in the wiring grooves 3 and connection holes 4 to form Cu wirings 6 and Cu plugs 7 in a completed product. At this time, the wiring material is deposited also at portions on the insulating film 2 which are not formed with the wiring grooves 3. Therefore, as viewed entirely, a metal film 8 is formed on the insulating film.

Then, in an unnecessary portion removing step 50, the unnecessary portions of the wiring material and the barrier film 5 deposited on the insulating film 2 are cut for removal, and flattening is performed so that the upper surface of the insulating film 2 becomes flush with the upper surface of the Cu wirings 6 formed on the insulating film 2. As shown in FIG. 1, the unnecessary portion removing step 50 includes a CMP step 501, a chemical cleaning step 502, a rinsing step 503 and a drying step 504, which will be described later.

Through the above-described process steps, the embedded wirings, i.e. conducting portions are formed. Simultaneously with the formation of such metal wirings, a conductor pad may be formed in the same layer from the wiring material. Alternatively, the conductor pad may separately be formed as a bonding pad from another metal material. By repeating the series of process steps described above, a multilayer wiring structure is provided.

Figure 3:
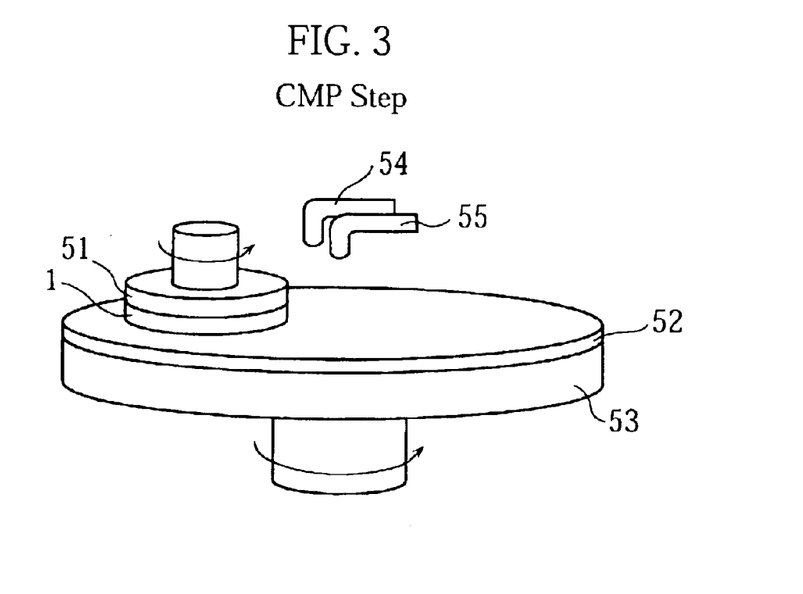
FIG. 3 is a perspective view illustrating the chemical mechanical polishing step in the multilayer wiring structure making process shown in FIG. 1.

FIG. 3 illustrates the CMP step 501 included in the unnecessary portion removing step 50 shown in FIG. 1. As shown in FIG. 3, in the CMP step 501, the wafer 1, as an object to be polished is secured to a polishing head 51 and is pressed against a platen 53 provided with a polishing cloth on the surface thereof. In this state, the polishing head 51 and the platen 53 are rotated while pouring a polishing liquid from a polishing liquid feed port 54, thereby polishing the surface of the wafer 1 for flattening. During the polishing, a pressure of 2–6 psi for example is applied between the wafer 1 and the polishing cloth 52, and the polishing head 51 and the platen 53 are rotated in the same direction at 50–100 rpm for example. The polishing cloth 52 is formed with grooves in the form of a lattice or concentric circles, which enables the polishing of the surface of the wafer 1. The CMP step in this embodiment comprises chemical slurry polishing and pure water polishing.

In the slurry polishing, the wafer 1 is polished using a chemical slurry as the polishing liquid. In this polishing, the chemical slurry is supplied from the polishing liquid feed port 54 to a generally central portion of the platen 53 at a flow rate of 100–200 ml/min. The chemical slurry may be a solution containing quinaldinic acid, lactic acid, colloidal silica (abrasive grain) and hydrogen peroxide. The chemical slurry may further contain benzotriazole as a corrosion inhibitor.

In the pure water polishing following the chemical slurry polishing, the wafer 1 is polished using pure water with a dissolved oxygen concentration decreased to no more than 6 ppm by weight, preferably no more than 4 ppm by weight as the polishing liquid. In this treatment, the pure water is supplied from a polishing liquid feed port 55 to a generally central portion of the platen 53 at a flow rate of 200–1500 ml/min. This polishing prevents the local corrosion of the metal wirings. To decrease the dissolved oxygen concentration in the pure water, use may be made of vacuum degassing, membrane vacuum degassing, thermal degassing, or bubbling of inert gas such as nitrogen or argon, for example. The dissolved oxygen concentration may be decreased also by adding methyl ethyl ketoxime, hydrazine, erythorbic acid, hydroquinone or the like to the pure water.

Figure 4:
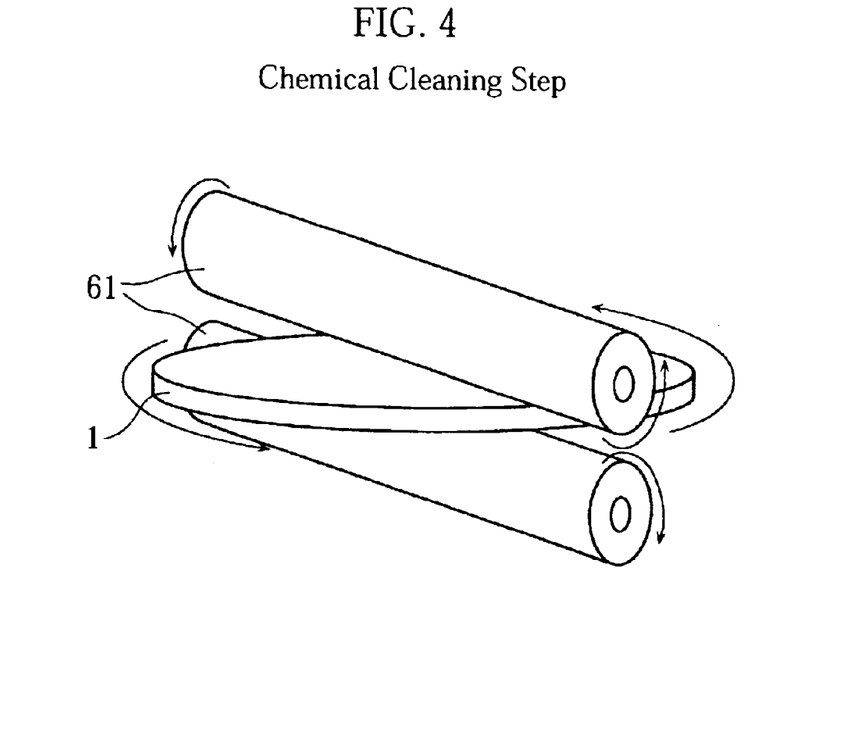
FIG. 4 is a perspective view illustrating the cleaning step subsequent to the chemical mechanical polishing step shown in FIG. 3.

FIG. 4 illustrates the chemical cleaning step 502 subsequent to the CMP step shown in FIG. 3. The chemical cleaning step 502 is carried out to remove metal contaminant or abrasive grain contaminant on the wafer 1 generated in the CMP step 501. In this step, the wafer 1 rotating at high speed is sandwiched between a pair of rotary brushes 61 formed of polyvinyl alcohol (PVA) and rotating at high speed for brushing. During the rotation of the rotary brushes 61, a cleaning liquid is supplied to the brush portions of the brushes. The cleaning liquid contains one or more active ingredients selected from organic acids such as oxalic acid, malonic acid, succinic acid, glutaric acid, adipic acid, maleic acid, fumaric acid, tartaric acid, citric acid, malic acid, acetic acid or salicylic acid, inorganic acid such as diluted hydrofluoric acid, and alkali such as ammonia. The cleaning liquid may contain a surface-active agent such as ammonium dodecylsulfonate or n-ammonium dodecylbenzenesulfonate. The cleaning liquid may contain a complexing agent such as EDTA. After the surface of the wafer 1 is brushed while supplying the cleaning liquid, pure water is supplied to the wafer through the same rotary brushes 61 for performing rinsing treatment to rinse off the cleaning liquid as the final treatment in the chemical cleaning step 502. The water used for the rinse treatment may have a dissolved oxygen concentration of no more than 6 ppm by weight and preferably no more than 4 ppm by weight, for example. When the pure water having a dissolved oxygen concentration which is not decreased to no more than 6 ppm by weight is used, the rinse treatment using the rotary brushes 61 is stopped before the concentration of the cleaning liquid reaches the ultralow concentration range. The rinse treatment need not necessarily be performed.

Figure 5:
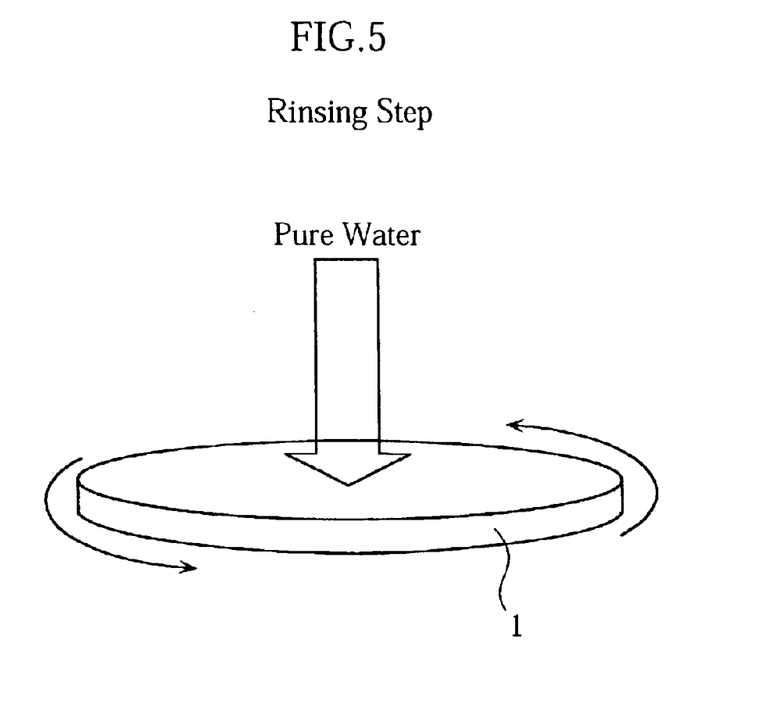
FIG. 5 is a perspective view illustrating the rinsing step subsequent to the cleaning step shown in FIG. 4.

FIG. 5 illustrates the rinsing step 503 subsequent to the chemical cleaning step 502 shown in FIG. 4. In the rinsing step 503, pure water having a dissolved oxygen concentration of no more than 6 ppm by weight, preferably no more than 4 ppm by weight, is supplied to the rotating wafer 1 from above through a rinsing liquid feedport 71. Because of the reasons described above, the use of water having a decreased dissolved oxygen concentration makes it possible to prevent the local corrosion of the metal wirings even when the concentration of the cleaning liquid passes the ultralow concentration range of $4.70 \times 10^{-4} - 1.96 \times 10^{-7}$ mol/l. The dissolved oxygen concentration of the pure water may be decreased in the same manner as that of the pure water used in the pure water polishing in the CMP step 501. The rinsing step 503 completes when the concentration of the cleaning liquid in the rinsing liquid reaches substantially zero.

Figure 6:
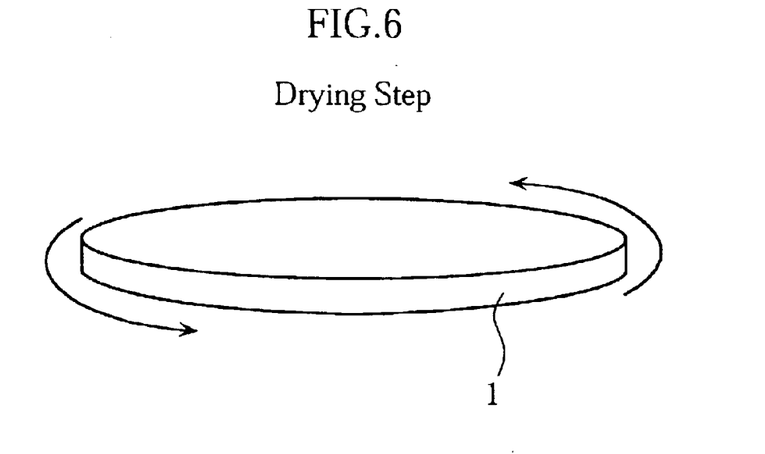
FIG. 6 is a perspective view illustrating the drying step subsequent to the rinsing step shown in FIG. 5.

FIG. 6 illustrates the drying step 504 subsequent to the rinsing step 503 shown in FIG. 5. In the drying step 504, the wafer is heated with a heater (not shown) disposed above the wafer 1 while rotating the wafer at high speed. In this way, the pure water used in the rinsing step 503 is evaporated, thereby drying the wafer.

Through the series of process steps including the CMP step 501, the chemical cleaning step 502, the rinsing step 503 and the drying step 504, the surface of the wafer 1 is sufficiently flattened while preventing the metal corrosion. The wafer 1 treated in this way can be subjected to the interlayer making step 10 for forming wirings in the next layer.

Figure 7:
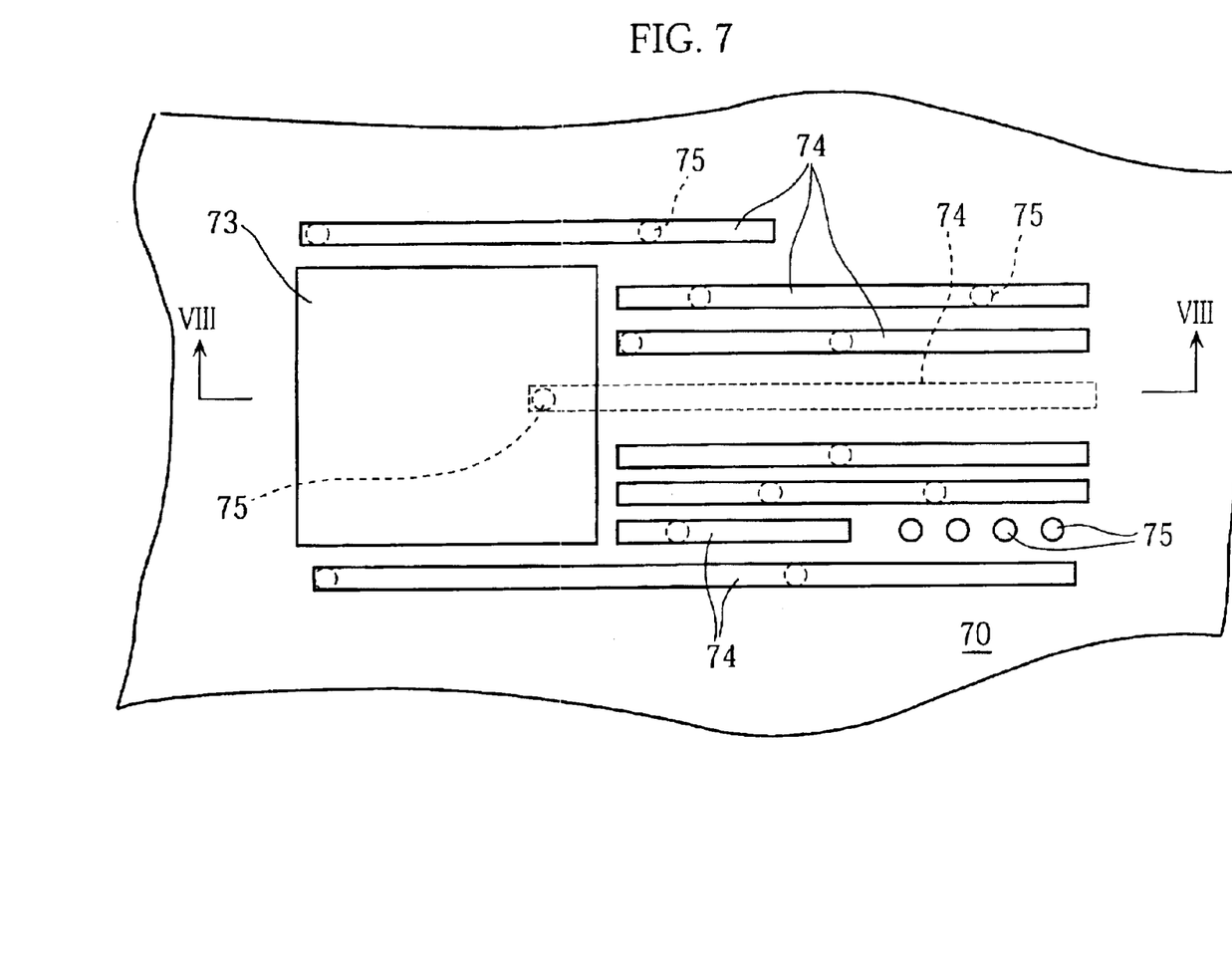
FIG. 7 is a plan view showing a wiring structure of a semiconductor device according to the present invention.
Figure 8:
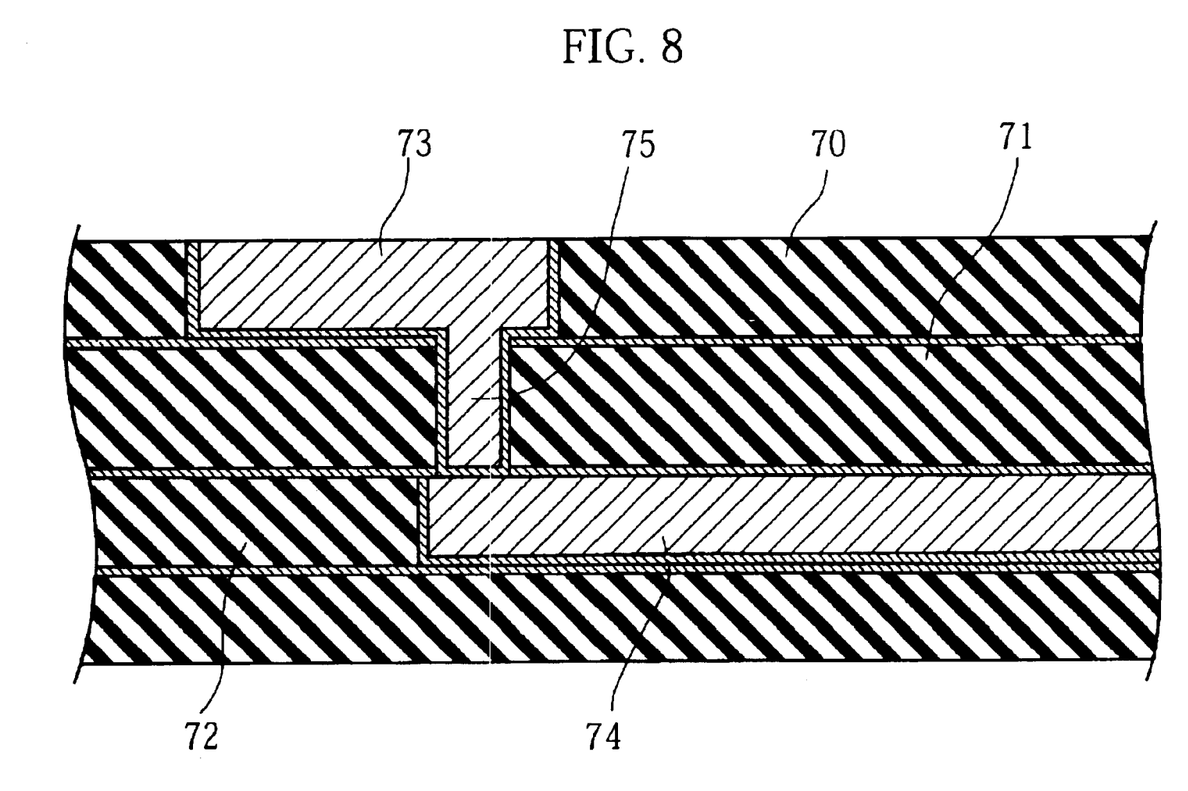
FIG. 8 is a sectional view taken along lines VIII—VIII in FIG. 7.

FIG. 7 is a plan view showing a multilayer wiring structure of a semiconductor device according to another embodiment of the present invention. FIG. 8 is a sectional view taken along lines VIII—VIII in FIG. 7.

In this embodiment, as shown in FIG. 8, the semiconductor device having a multilayer wiring structure includes a plurality of insulating films 70, 71, 72 (See FIG. 8). As shown in FIG. 7, each of the insulating film 70, 71, 72 is formed with a plurality of pads (only one shown), a plurality of wirings 74, and a plurality of connection holes 75 (metal plugs). The insulating films differ from each other in formation pattern of the pads 73, the wirings 74 and the connection holes 75. Each of the pads 73 in each insulating film (for example, in the insulating film 70) is separated from all the wirings 74 of the same layer (See FIG. 8), but is electrically connected, via the connection hole 75 formed in the adjacent insulating film (for example, the insulating film 71), to one of the wirings 74 of another insulating film (for example, the insulating film 72).

In the semiconductor device having such a multilayer wiring structure, each of the pads 73 is not connected to any of the wirings 74 in the same insulating film. Moreover, the total surface area of the conducting portions electrically connected to each other is no more than 500 $\mu m^2$ in the same layer. Therefore, even when pure water having a relatively high dissolved oxygen concentration is used in the rinsing step, causing corrosion by the cell reaction due to the localization of anodes and cathodes respectively at the edges and at other portions of the pad 73 as a conducting portion, such corrosion does not provide a significant problem, because the ratio of the loss of the wirings relative to the conductive volume of the pad is small.

The present invention is particularly effective in forming a Cu or Cu alloy wiring having a width of no more than 1.0 $\mu m$. This is because, when the wiring has a width of no more than 1.0 $\mu m$, the local corrosion provides a large influence. Particularly when the wiring has a width of no more than 0.5 $\mu m$, the local corrosion causes a serious problem.

To prove the effects of the present invention, various examples and comparative examples will be described below.

In the examples and comparative examples, Cu wirings having a width of 1.0, 0.5 and 0.27 $\mu m$ were used. The existence or nonexistence of local corrosion is checked with respect to each of a set of conducting portions electrically connected to each other to have a surface area of no less than 500 $\mu m^2$ in a same layer. The set of conducting portions having a surface area of no less than 500 $\mu m^2$ consisted of a pad, and a wiring electrically connected to the pad. The evaluation was performed by checking whether local corrosion occurred at the edges of the wiring. The same phenomenon occurs even at another type of conducting portion set if only the set of conducting portions has a surface area of no less than 500 $\mu m^2$.

EXAMPLE 1

In this example, in the chemical cleaning step 502 subsequent to the CMP step 501, wafers 1 were cleaned using cleaning liquids each containing a single kind of reagent at a predetermined concentration. Then, in the rinsing step 503, the wafers 1 were rinsed using pure water of a decreased dissolved oxygen concentration.

In this example, for the single kind of reagent in each cleaning liquid, use was made of oxalic acid, malonic acid, succinic acid, glutaric acid, adipic acid, maleic acid, fumaric acid, tartaric acid, citric acid, malic acid, acetic acid or salicylic acid which are organic acids, diluted hydrofluoric acid which is inorganic acid, or aqueous ammonia which is alkali. The decrease of the dissolved oxygen concentration of the pure water for the rinsing step 503 was performed by membrane vacuum degassing or bubbling of inert gas (nitrogen or argon) to the concentration range of 1–4 ppm by weight.

For example, with respect to wafers 1 cleaned in the chemical cleaning step 502 with a cleaning liquid containing oxalic acid at the concentration of $0.7 \times 10^{-2}$ mol/l, two kinds of rinsing were performed one of which was rinsing with pure water whose dissolved oxygen concentration was decreased to 1 ppm by weight by membrane vacuum degassing and the other of which was rinsing with pure water whose dissolved oxygen concentration was decreased to 1 ppm by bubbling of nitrogen gas. Further, with respect to wafers cleaned in the chemical cleaning step 502 with a cleaning liquid containing adipic acid at the concentration of $2.5 \times 10^{-2}$ mol/l, two kinds of rinsing were performed one of which was rinsing with pure water whose dissolved oxygen concentration was decreased to 3 ppm by weight by membrane vacuum degassing and the other of which was rinsing with pure water whose dissolved oxygen concentration was decreased to 1 ppm by bubbling of argon gas.

Table 1 shows the resulting surface condition of the Cu wirings on each of the wafers which were dried in the drying step 504 after having undergone the above-described chemical cleaning step 502 and rinsing step 503. In the wafers after these process steps, local corrosion of the wiring material, i.e. local loss was not found at the edges of the Cu wiring of the set of conducting portions electrically connected to each other to have a surface area of no less than 500 $\mu m^2$ in a same layer. For example, the wafers 1 cleaned with the cleaning liquid containing oxalic acid did not suffer from local corrosion both when the rinsing was performed using pure water whose dissolved oxygen concentration was decreased by membrane vacuum degassing and when the rinsing was performed using pure water whose dissolved oxygen concentration was decreased by bubbling of nitrogen gas.

TABLE 1

| Reagent in Cleaning Liquid (Concentration) | Dissolved Oxygen Concentration in Pure Water for Rinsing/ppm by weight | | | Influences on Cu Wiring |
|---|---|---|---|---|
| | Membrane Degassing | Bubbling by Inert Gas $N_2$ | Ar | |
| Oxalic acid ($0.7 \times 10^{-2}$ mol/l) | 1 | 1 | — | No Loss |
| Malonic acid ($1.2 \times 10^{-2}$ mol/l) | 2 | 1 | — | No Loss |
| Succinic acid ($1.0 \times 10^{-2}$ mol/l) | 1 | 2 | — | No Loss |
| Glutaric acid ($1.8 \times 10^{-2}$ mol/l) | 1 | 1 | — | No Loss |
| Adipic acid ($2.5 \times 10^{-2}$ mol/l) | 3 | — | 1 | No Loss |

TABLE 1-continued

| Reagent in Cleaning Liquid (Concentration) | Dissolved Oxygen Concentration in Pure Water for Rinsing/ppm by weight | | | Influences on Cu Wiring |
|---|---|---|---|---|
| | Membrane Degassing | Bubbling by Inert Gas $N_2$ | Ar | |
| Maleic acid ($1.7 \times 10^{-2}$ mol/l) | 2 | — | 2 | No Loss |
| Fumaric acid ($1.6 \times 10^{-2}$ mol/l) | 1 | — | 2 | No Loss |
| Tartaric acid ($3.5 \times 10^{-2}$ mol/l) | 3 | — | 2 | No Loss |
| Citric acid ($1.6 \times 10^{-2}$ mol/l) | 2 | 1 | — | No Loss |
| Malic acid ($0.9 \times 10^{-2}$ mol/l) | 4 | 1 | — | No Loss |
| Acetic acid ($1.9 \times 10^{-2}$ mol/l) | 2 | 1 | — | No Loss |
| Salicylic acid ($1.1 \times 10^{-2}$ mol/l) | 1 | — | 2 | No Loss |
| Glutaric acid ($2.5 \times 10^{-2}$ mol/l) | 1 | 2 | — | No Loss |
| DHF (0.5 wt %) | — | — | 1 | No Loss |
| $NH_3$aq ($0.6 \times 10^{-2}$ mol/l) | — | — | 1 | No Loss |

EXAMPLE 2

In this example, in the chemical cleaning step 502 subsequent to the CMP step 501, wafers 1 were cleaned using cleaning liquids each containing oxalic acid, malonic acid, succinic acid, glutaric acid or citric acid at a predetermined concentration, and ammonium dodecylsulfonate or n-ammonium dodecylbenzenesulfonate as a surface-active agent at the concentration of 200 ppm by weight. Then, in the rinsing step 503, the wafers 1 were rinsed using pure water whose dissolved oxygen concentration was decreased to 1 or 2 ppm by weight by membrane vacuum degassing.

Table 2 shows the resulting surface condition of the Cu wiring on each of the wafers which were dried in the drying step 504 after having undergone the above-described chemical cleaning step 502 and rinsing step 503. In the wafers after these process steps, local loss of the wiring material was not found at the edges of the Cu wiring of the set of conducting portions electrically connected to each other to have a surface area of no less than 500 $\mu m^2$ in a same layer. Although the decrease of the dissolved oxygen concentration was performed by membrane vacuum degassing in this example, such a decrease of dissolved oxygen concentration may be performed by bubbling of nitrogen gas or argon gas.

TABLE 2

| Reagent in Cleaning Liquid (Concentration) | Dissolved Oxygen Concentration in Pure water for Rinsing/ppm by weight (Membrane Degassing) | Influences on Cu Wiring |
|---|---|---|
| Oxalic acid ($0.8 \times 10^{-2}$ mol/l) Ammonium dodecylsulfonate (200 ppm) | 1 | No Loss |
| Malonic acid ($1.2 \times 10^{-2}$ mol/l) Ammonium dodecylsulfonate (200 ppm) | 2 | No Loss |

TABLE 2-continued

| Reagent in Cleaning Liquid (Concentration) | Dissolved Oxygen Concentration in Pure water for Rinsing/ppm by weight (Membrane Degassing) | Influences on Cu Wiring |
|---|---|---|
| Succinic acid ($1.6 \times 10^{-2}$ mol/l) n-ammonium dodecylbenzenesulfonate (200 ppm) | 1 | No Loss |
| Glutaric acid ($1.6 \times 10^{-2}$ mol/l) n-ammonium dodecylbenzenesulfonate (200 ppm) | 1 | No Loss |
| Citric acid ($1.5 \times 10^{-2}$ mol/l) n-ammonium dodecylbenzenesulfonate (200 ppm) | 1 | No Loss |

EXAMPLE 3

In this example, seven kinds of wafers were selected from the semiconductor devices provided with exposed Cu wirings which did not suffer from local loss even after having undergone the process steps performed under the conditions of Example 1. Each of the seven wafers was immersed in a corresponding kind of liquid for 30 minutes. Specifically, each wafer was immersed in a solution prepared by diluting a cleaning liquid containing the reagent used for that wafer in the chemical cleaning step 502 with pure water of a decreased dissolved oxygen concentration. The dissolved oxygen concentration of the pure water for the dilution was decreased by bubbling of nitrogen gas.

Table 3 shows the resulting surface condition of the Cu wiring on each of the wafers which were dried after having undergone such immersion. In the wafers after these process steps, local loss of the wiring material was not found at the edges of the Cu wiring of the set of conducting portions electrically connected to each other to have a surface area of no less than 500 $\mu m^2$ in a same layer.

TABLE 3

| Reagent in Cleaning Liquid (Concentration) | Rate of Dilution | Dissolved Oxygen Concentration in Pure water for Rinsing/ppm by weight (Bubbling by $N_2$ gas) | Influences on Cu Wiring |
|---|---|---|---|
| Oxalic acid ($0.8 \times 10^{-2}$ mol/l) | 10000 times | 1 | No Loss |
| Malonic acid ($1.2 \times 10^{-2}$ mol/l) | 1000 times | 2 | No Loss |
| Citric acid ($1.6 \times 10^{-2}$ mol/l) | 5000 times | 1 | No Loss |
| Malic acid ($0.9 \times 10^{-2}$ mol/l) | 300 times | 2 | No Loss |
| Tartaric acid ($3.5 \times 10^{-2}$ mol/l) | 8000 times | 3 | No Loss |
| DHF (0.5 wt %) | 80000 times | 1 | No Loss |
| NH3 aq ($0.6 \times 10^{-2}$ mol/l) | 30000 times | 1 | No Loss |

EXAMPLE 4

In this example, three kinds of wafers were selected from the semiconductor devices provided with exposed Cu wirings which did not suffer from local loss even after having undergone the process steps under the condition of Example 2. Each of the three wafers was immersed in a corresponding kind of liquid for 30 minutes. Specifically, each wafer was immersed in a solution prepared by diluting a cleaning liquid containing the reagent used for that wafer in the chemical cleaning step 502 with pure water of a decreased dissolved oxygen concentration. The dissolved oxygen concentration of the pure water for the dilution was decreased by bubbling of nitrogen gas.

Table 4 shows the resulting surface condition of the Cu wiring on each of the wafers which were dried in the drying step 504 after having undergone such immersion. In the wafers after these process steps, local loss of the wiring material was not found at the edges of the Cu wiring of the set of conducting portions electrically connected to each other to have a surface area of no less than 500 $\mu m^2$ in a same layer.

TABLE 4

| Reagent in Cleaning Liquid (Concentration) | Rate of Dilution | Dissolved Oxygen Concentration in Pure water for Rinsing/ppm by weight (Bubbling by $N_2$ gas) | Condition of Cu Wiring |
|---|---|---|---|
| Oxalic acid ($0.8 \times 10^{-2}$ mol/l) Ammonium dodecylsulfonate (200 ppm) | 500 times | 1 | No Loss |
| Malonic acid ($1.2 \times 10^{-2}$ mol/l) Ammonium dodecylsulfonate (200 ppm) | 50000 times | 2 | No Loss |
| Citric acid ($1.5 \times 10^{-2}$ mol/l) n-ammonium dodecylbenzenesulfonate (200 ppm) | 10000 times | 1 | No Loss |

EXAMPLE 5

In this example, the pure water polishing in the CMP step 501 was performed using pure water whose dissolved oxygen concentration was decreased to no more than 1 ppm as the polishing liquid. The dissolved oxygen concentration of the pure water was decreased by membrane vacuum degassing. After the pure water polishing and the subsequent drying step 504, an upper layer was laminated.

The resulting surface condition of the Cu wiring on the wafer after the CMP step 501 and the drying step 504 is given in Table 5. In the wafer after these process steps, local loss of the wiring material was not found at the edges of the Cu wiring of the set of conducting portions electrically connected to each other to have a surface area of no less than 500 $\mu m^2$ in a same layer. Also given in Table 5 is the state of adhesion between Cu and the interlayer insulating film when the upper layer is laminated. The release of the laminated layer did not occur.

EXAMPLE 6

In this example, in a semiconductor device having a multilayer wiring structure, a wiring pattern was formed in which conducting portions electrically connected to each other, including a wiring of a width of no more than 1.0 $\mu m$ as a surface area of no more than 500 $\mu m^2$ in a same layer. In this example, the rinsing step was performed using pure water whose dissolved oxygen concentration was not decreased.

The resulting surface condition of the Cu wiring on the wafer dried after such rinsing step is given in Table 5. In the wafer after these process steps, local loss of the wiring material was not found at the edges of the Cu wiring.

TABLE 5

| Performed Example | Influences on Cu Wiring | Release of Laminated Layer |
|---|---|---|
| Example 5 | No Loss | Not found |
| Example 6 | No Loss | — |
| Comparative Example 5 | Local Loss Found | — |
| Comparative Example 6 | No Loss | Found |
| Comparative Example 7 | Local Loss Found | — |

COMPARATIVE EXAMPLE 1

In this example, in the chemical cleaning step 502 subsequent to the CMP step 501, wafers 1 were cleaned using cleaning liquids each containing a single kind of reagent at a predetermined concentration. Then, in the rinsing step 503, the wafers 1 were rinsed using pure water whose dissolved oxygen concentration was not decreased.

In this example, for the single kind of reagent in each cleaning liquid, use was made of oxalic acid, malonic acid, succinic acid, glutaric acid, adipic acid, maleic acid, fumaric acid, tartaric acid, citric acid, malic acid, acetic acid or salicylic acid which are organic acids, diluted hydrofluoric acid which is inorganic acid, or aqueous ammonia which is alkali.

Table 6 shows the resulting surface condition of the Cu wiring on each of the wafers which were dried in the drying step 504 after having undergone the above-described chemical cleaning step 502 and rinsing step 503. In the wafers after these process steps, local corrosion of the wiring material, i.e. local loss was found at the edges of the Cu wiring of the set of conducting portions electrically connected to each other to have a surface area of no less than 500 µm in a same layer.

TABLE 6

| Reagent in Cleaning Liquid (Concentration) | Dissolved Oxygen Concentration in Pure water for Rinsing/ppm by weight | Influences on Cu Wiring Pattern |
|---|---|---|
| Oxalic acid (0.7 × 10$^{-2}$ mol/l) | 8 | Local Loss Found |
| Malonic acid (1.2 × 10$^{-2}$ mol/l) | 8 | Local Loss Found |
| Succinic acid (1.0 × 10$^{-2}$ mol/l) | 9 | Local Loss Found |
| Glutaric acid (1.8 × 10$^{-2}$ mol/l) | 8 | Local Loss Found |
| Adipic acid (2.5 × 10$^{-2}$ mol/l) | 9 | Local Loss Found |
| Maleic acid (1.7 × 10$^{-2}$ mol/l) | 8 | Local Loss Found |
| Fumaric acid (1.6 × 10$^{-2}$ mol/l) | 8 | Local Loss Found |
| Tartaric acid (3.5 × 10$^{-2}$ mol/l) | 8 | Local Loss Found |
| Citric acid (1.6 × 10$^{-2}$ mol/l) | 9 | Local Loss Found |
| Malic acid (0.9 × 10$^{-2}$ mol/l) | 9 | Local Loss Found |
| Acetic acid (1.9 × 10$^{-2}$ mol/l) | 9 | Local Loss Found |
| Salicylic acid (1.1 × 10$^{-2}$ mol/l) | 8 | Local Loss Found |
| Glutaric acid (2.5 × 10$^{-2}$ mol/l) | 8 | Local Loss Found |
| DHF (0.5 wt %) | 8 | Local Loss Found |
| NH$^3$ aq (0.6 × 10$^{-2}$ mol/l) | 8 | Local Loss Found |

TABLE 6-continued

COMPARATIVE EXAMPLE 2

In this example, in the chemical cleaning step 502, wafers 1 were cleaned using cleaning liquids each containing a combination of reagents as given in Table 7, similarly to Example 2. Then, in the rinsing step 503, the wafers 1 were rinsed using pure water whose dissolved oxygen concentration was not decreased.

Table 7 shows the resulting surface condition of the Cu wiring on each of the wafers which were dried in the drying step 504 after having undergone the above-described chemical cleaning step 502 and rinsing step 503. In the wafers after these process steps, local loss of the wiring material was found at the edges of the Cu wiring of the set of conducting portions electrically connected to each other to have a surface area of no less than 500 µm in a same layer.

TABLE 7

| Reagent in Cleaning Liquid (Concentration) | Dissolved Oxygen Concentration in Pure water for Rinsing/ppm by weight | Influences on Cu Wiring |
|---|---|---|
| Oxalic acid (0.8 × 10$^{-2}$ mol/l) Ammonium dodecylsulfonate (200 ppm) | 9 | Local Loss Found |
| Malonic acid (1.2 × 10$^{-2}$ mol/l) Ammonium dodecylsulfonate (200 ppm) | 8 | Local Loss Found |
| Succinic acid (1.6 × 10$^{-2}$ mol/l) n-ammonium dodecylbenzenesulfonate (200 ppm) | 8 | Local Loss Found |
| Glutaric acid (1.6 × 10$^{-2}$ mol/l) n-ammonium dodecylbenzenesulfonate (200 ppm) | 8 | Local Loss Found |
| Citric acid (1.5 × 10$^{-2}$ mol/l) n-ammonium dodecylbenzenesulfonate (200 ppm) | 8 | Local Loss Found |

COMPARATIVE EXAMPLE 3

In this example, similarly to Example 3, seven kinds of wafers were selected from the semiconductor devices provided with exposed Cu wirings which did not suffer from local loss even after having undergone the process steps under the condition of Example 1. Each of the seven wafers was immersed in a corresponding kind of liquid for 30 minutes. Specifically, each wafer was immersed in a solution prepared by diluting a cleaning liquid containing the reagent used for that wafer in the chemical cleaning step 502 with pure water whose dissolved oxygen concentration was not decreased.

Table 8 shows the resulting surface condition of the Cu wiring on each of the wafers which were dried after having undergone such immersion. In the wafers after these process steps, local loss of the wiring material was found at the edges of the Cu wiring of the set of conducting portions electrically connected to each other to have a surface area of no less than 500 μm² in a same layer.

TABLE 8

| Reagent in Cleaning Liquid (Concentration) | Rate of Dilution | Dissolved Oxygen Concentration in Pure water for Rinsing/ppm by weight | Influences on Cu Wiring |
|---|---|---|---|
| Oxalic acid (0.8 × 10⁻² mol/l) | 10000 times | 8 | Local Loss Found |
| Malonic acid (1.2 × 10⁻² mol/l) | 1000 times | 9 | Local Loss Found |
| Citric acid (1.6 × 10⁻² mol/l) | 5000 times | 9 | Local Loss Found |
| Malic acid (0.9 × 10⁻² mol/l) | 300 times | 9 | Local Loss Found |
| Tartaric acid (3.5 × 10⁻² mol/l) | 8000 times | 8 | Local Loss Found |
| DHF (0.5 wt %) | 80000 times | 8 | Local Loss Found |
| NH₃ aq (0.6 × 10⁻² mol/l) | 30000 times | 8 | Local Loss Found |

COMPARATIVE EXAMPLE 4

In this example, similarly to Example 4, three kinds of wafers were selected from the semiconductor devices provided with exposed Cu wirings which did not suffer from local loss even after having undergone the process steps under the conditions of Example 2. Each of the three wafers was immersed in a corresponding kind of liquid for 30 minutes. Specifically, each wafer was immersed in a solution prepared by diluting a cleaning liquid containing the reagent used for that wafer in the chemical cleaning step 502 with pure water whose dissolved oxygen concentration was not decreased.

Table 9 shows the resulting surface condition of the Cu wiring on each of the wafers which were dried after having undergone such immersion. In the wafers after these process steps, local loss of the wiring material was found at the edges of the Cu wiring of the set of conducting portions electrically connected to each other to have a surface area of no less than 500 μm² in a same layer.

TABLE 9

| Reagent in Cleaning Liquid (Concentration) | Rate of Dilution | Dissolved Oxygen Concentration in Pure water for Rinsing/ppm by weight | Influences on Cu Wiring |
|---|---|---|---|
| Oxalic acid (0.8 × 10⁻² mol/l) Ammonium dodecylsulfonate (200 ppm) | 500 times | 8 | Local Loss Found |
| Malonic acid (1.2 × 10⁻² mol/l) Ammonium dodecylsulfonate (200 ppm) | 50000 times | 8 | Local Loss Found |
| Citric acid (1.5 × 10⁻² mol/l) n-ammonium dodecyl-benzenesulfonate (200 ppm) | 10000 times | 8 | Local Loss Found |

COMPARATIVE EXAMPLE 5

In this example, the pure water polishing in the CMP step 501 was performed using pure water whose dissolved oxygen concentration was not decreased.

The resulting surface condition of the Cu wiring after such CMP step 501 and the drying step 504 is given in Table 5. In the wafer after these process steps, local loss of the wiring material was found at the edges of the Cu wiring of the set of conducting portions electrically connected to each other to have a surface area of no less than 500 μm² in a same layer.

COMPARATIVE EXAMPLE 6

In this example, the pure water polishing in the CMP step 501 was performed using pure water whose dissolved oxygen concentration was not decreased but which contained benzotriazole as a corrosion inhibitor at the concentration of 500 ppm by weight.

The resulting surface condition of the Cu wiring on the wafer dried after such CMP step 501 is given in Table 5. In the wafer after these process steps, local loss of the wiring material was not found at the edges of the Cu wiring of the set of conducting portions electrically connected to each other to have a surface area of no less than 500 μm² in a same layer. However, when an upper layer is laminated, adhesion failure occurred between Cu and the interlayer insulating film, resulting in the release of the laminated layer.

COMPARATIVE EXAMPLE 7

In this example, in a semiconductor device having a multilayer wiring structure, a wiring pattern was formed in which conducting portions electrically connected to each other, including a wiring of a width of no more than 1.0 μm, had a surface area of no more than 600 μm² in a same layer. In this example, the rinsing step in the unnecessary portion removing step 50 was performed using pure water whose dissolved oxygen concentration was not decreased as the rinsing liquid.

The resulting surface condition of the Cu wiring dried after such rinsing step is given in Table 5. In the wafer after these process steps, local loss of the wiring material was found at the edges of the Cu wiring.

EVALUATION

According to the present invention, in the process for manufacturing a semiconductor device having a multilayer wiring structure, pure water of a decreased dissolved oxygen concentration is used as the polishing liquid in the pure water polishing in the CMP step. This prevents local corrosion, i.e. local loss of a Cu or Cu alloy wiring at the edges of the conducting portions electrically connected to each other to have a surface area of no less than 500 μm² in a same layer. Such effect is provided when the dissolved oxygen concentration is no more than 6 ppm by weight, but further lower concentration is preferable. It is preferable that the dissolved oxygen concentration is no more than 4 ppm by weight.

Further, according to the present invention, pure water of a decreased dissolved oxygen concentration is used as the rinsing liquid in the rinsing step after the cleaning step performed accompanying the CMP step. This prevents local corrosion, i.e. local loss of a Cu or Cu alloy wiring at the edges of the conducting portions electrically connected to each other to have a surface area of no less than 500 μ² in a same layer.

Moreover, according to another aspect of the present invention, a conductor pattern is formed in which a wiring has a width of no more than 1.0 μm and each of the conducting portions electrically connected to each other has a surface area of no more than 500 $\mu m^2$ in a same layer. With this structure, local corrosion, i.e. local loss of the Cu or Cu alloy wiring at the edges of the conducting portions can be prevented even when a liquid whose dissolved oxygen concentration is not decreased is used in the pure water polishing in the CMP step or in the rinsing step after the cleaning step in the semiconductor device manufacturing process.

What is claimed is:

1. A method of manufacturing a semiconductor device having a multilayer wiring structure in which at least one insulating film is formed with conductor pattern which includes at least one set of conducting portions electrically connected to each other, said at least one set of conducting portions having a surface area of no less than 500 $\mu m^2$, the method comprising:
   a polishing step for flattening the conducting portions together with the insulating film by chemical mechanical polishing;
   a chemical cleaning step for cleaning a flattened surface of the insulating film with a cleaning liquid; and
   a rinsing step for removing the cleaning liquid using a rinsing liquid,
   wherein the rinsing step is performed using water with a dissolved oxygen concentration decreased to no more than 6 ppm by weight as the rinsing liquid, and
   wherein the polishing step includes a first polishing treatment using a chemical slurry and a polishing tool, the polishing step further including a second polishing treatment using said polishing tool and water with a dissolved oxygen concentration decreased to no more than 6 ppm by weight.

2. The method of manufacturing a semiconductor device according to claim 1, wherein the dissolved oxygen concentration of the water as the rinsing liquid is no more than 4 ppm by weight.

3. The method of manufacturing a semiconductor device according to claim 1, wherein the conductor pattern is formed of Cu or a Cu alloy.

4. The method of manufacturing a semiconductor device according to claim 1, wherein the set of conducting portions includes a pad, and a wiring directly connected to the pad.

5. The method of manufacturing a semiconductor device according to claim 4, wherein the wiring of the conducting portions has a width of no more than 1.0 $\mu m$.

6. The method of manufacturing a semiconductor device according to claim 1, wherein the set of the conducting portions of the one insulating film includes a plurality of wirings which are electrically connected to each other via a conductor pattern of an underlying insulating film.

7. The method of manufacturing a semiconductor device according to claim 6, wherein each of the wirings has a width of no more than 1.0 $\mu m$.

8. The method of manufacturing a semiconductor device according to claim 1, wherein the dissolved oxygen concentration of the water used in the second polishing treatment is no more than 4 ppm by weight.

9. A method of manufacturing a semiconductor device having a multilayer wiring structure in which at least one insulating film is formed with conductor pattern which includes at least one set of conducting portions electrically connected t each other, said at least one set of conducting portions having a surface area of no less than 500 $\mu m^2$, the method comprising:
   an insulating film forming step for forming an insulating film on a substrate;
   a pattern forming step for forming a wiring groove and a connection hole in the insulating film;
   a conductor forming step for applying a metal material to the insulating film to fill the wiring groove and the connection hole with the metal material;
   a polishing step for polishing the metal material and the insulating film by chemical mechanical polishing so that the metal material filled in the wiring groove and the connection hole remains as conducting portions;
   a cleaning step for cleaning the polished insulating film and the conducting portions with a cleaning liquid;
   a rinsing step for removing the cleaning liquid with water with a dissolved oxygen concentration of no more than 6 ppm by weight; and
   a drying step for removing the water use in the rinsing step; and
   wherein the polishing step includes a first polishing treatment using a chemical slurry and a polishing tool, the polishing step further including a second polishing treatment using said polishing tool and water with a dissolved oxygen concentration decreased to no more than the 6 ppm by weight.

10. The method of manufacturing a semiconductor device according to claim 9, wherein the dissolved oxygen concentration of the water as the rinsing liquid is no more than 4 ppm by weight.

11. The method of manufacturing a semiconductor device according to claim 9, wherein the metal material is Cu or a Cu alloy.

12. The method of manufacturing a semiconductor device according to claim 9, wherein the set of conducting portions includes a pad, and a wiring directly connected to the pad.

13. The method of manufacturing a semiconductor device according to claim 12, wherein the wiring of the conducting portions has a width of no more than 1.0 $\mu m$.

14. The method of manufacturing a semiconductor device according to claim 9, wherein the set of the conducting portions of the one insulating film includes a plurality of wirings which are electrically connected to each other via a conductor pattern of an underlying insulating film.

15. The method of manufacturing a semiconductor device according to claim 14, wherein each of the wirings has a width of no more than 1.0 $\mu m$.

16. The method of manufacturing a semiconductor device according to claim 9, wherein the dissolved oxygen concentration of the water used in the second polishing treatment is no more than 4 ppm by weight.

* * * * *